United States Patent
Kiesewetter et al.

(10) Patent No.: US 6,864,676 B2
(45) Date of Patent: Mar. 8, 2005

(54) SUBSTRATE-HOLDING DEVICE FOR TESTING CIRCUIT ARRANGEMENTS ON SUBSTRATES

(75) Inventors: Jorg Kiesewetter, Dresden (DE); Michael Teich, Friedewald (DE); Stefan Schneidewind, Reichenberg (DE); Claus Dietrich, Sacke (DE)

(73) Assignee: SUSS MicroTec Testsystems (GmbH), Sacka bei Dresden (DE)

( * ) Notice: Subject to any disclaimer, the term of this patent is extended or adjusted under 35 U.S.C. 154(b) by 0 days.

(21) Appl. No.: 10/139,735

(22) Filed: May 6, 2002

(65) Prior Publication Data

US 2002/0163350 A1 Nov. 7, 2002

(30) Foreign Application Priority Data

May 7, 2001 (DE) .......................................... 101 22 036

(51) Int. Cl.⁷ ............................................... G01R 31/02
(52) U.S. Cl. ..................................... 324/158.1; 324/758
(58) Field of Search ................................ 324/765, 754, 324/158.1, 755, 758; 361/234; 279/128

(56) References Cited

U.S. PATENT DOCUMENTS

| | | | | |
|---|---|---|---|---|
| 5,151,845 A | * | 9/1992 | Watanabe et al. | 361/234 |
| 5,191,506 A | * | 3/1993 | Logan et al. | 361/234 |
| 5,207,437 A | | 5/1993 | Barnes et al. | 279/128 |
| 5,280,156 A | | 1/1994 | Niori et al. | 218/385 |
| 5,457,398 A | | 10/1995 | Schwindt et al. | 324/754 |
| 5,539,179 A | * | 7/1996 | Nozawa et al. | 219/121.43 |
| 5,610,529 A | | 3/1997 | Schwindt | 324/760 |
| 5,646,814 A | * | 7/1997 | Shamouilian et al. | 361/234 |
| 5,909,355 A | * | 6/1999 | Parkhe | 361/234 |
| 6,133,557 A | | 10/2000 | Kawanabe et al. | 219/544 |
| 6,259,592 B1 | * | 7/2001 | Ono | 361/234 |

* cited by examiner

Primary Examiner—David Zarneke
Assistant Examiner—Tung X. Nguyen
(74) Attorney, Agent, or Firm—Baker Botts LLP

(57) ABSTRACT

A substrate-holding device is designed as a one-piece ceramic element having a number of variably heavily doped layer regions. At least one layer region is a conductive region and at least one layer region is an insulative region. A multilayer chuck structure is thereby formed which does not exhibit mechanical surface interfaces between the layers.

10 Claims, 2 Drawing Sheets

SUBSTRATE-HOLDING DEVICE FOR TESTING CIRCUIT ARRANGEMENTS ON SUBSTRATES

FIELD OF THE INVENTION

The invention relates to a substrate-holding device for probes for testing circuit arrangements on substrates and more particularly to a monolithic substrate-holding device.

BACKGROUND OF THE INVENTION

A substrate holder of the type mentioned at the beginning is described in U.S. Pat. No. 5,457,398. It has first and second elements that are electrically insulated from one another, the first element of the substrate holder having an upper surface for the horizontal accommodation of a test circuit for testing by an electric probe. The substrate holder is surrounded by a sheath. This arrangement is provided for a triaxial structure. For this purpose, the second element has upper and lower parts, each of which consists of conductive material. In addition, there is applied a first non-zero potential difference between the first element of the clamping device and the outer sheath and a second non-zero potential difference, which is substantially equal to the first potential difference, between the second element of the clamping device and the outer sheath. Hence, the first element carries a force potential, the second element carries a guard potential and the sheath carries a shield potential.

The growing number of applications in the field of measurement of low currents in the femtoampere range ($10^{-15}$ A) and in the attoampere range ($10^{-18}$ A) makes the development of increasingly sensitive measuring equipment necessary. The increasing number of sources of interference (e.g., increasingly stronger wireless message transmission) makes increasingly better shielding or other measuring and compensating methods also necessary. Added to this are additional parameters (e.g., temperature of the substrate) that must be kept spatially and temporally constant with great accuracy during the measuring process. Well thought-out arrangements with careful selection of material are required to obtain spatial constancy of the corresponding specified parameters. Precise and reliable control technology provides appropriate temporal parameter constancy.

The measurement of small currents with rapid signal rise times requires a measuring arrangement with small parasitic capacities in the signal path and high insulating resistances over the entire temperature range. The observance of parameter temperature necessitates good thermal contact of the substrate. Along with all the rest of the measuring arrangement (e.g. measuring chamber, probe heads and probe needles), the substrate-holding arrangement, or chuck, is of great importance.

U.S. Pat. No. 5,610,529 discloses a structure of a substrate holder that has an electrically conductive holding plate. This holding plate adjoins an insulating plate. Below the insulating plate, there is provided a so-called thermochuck, which provides for the addition or removal of energy to or from the substrate, depending on whether it is to be tested at high or low temperatures.

Here, addition or removal of thermal energy may be effected conventionally or alternatively by gases or liquids controlled externally and conveyed through the thermochuck, as described in U.S. Pat. Nos. 4,426,619 and 4,734,872.

In this arrangement, the holding plate carries a force potential and the thermochuck a guard potential.

It has been found that such an arrangement produces non-homogeneities in the conduction of heat to the substrate. As a result, a frictional electric effect, which results in interference with the measurement, cannot be avoided here.

SUMMARY OF THE INVENTION

Therefore, an object of the invention is to improve the homogeneity of thermal conduction to the substrate and increase the accuracy of measurement.

According to the invention, this object is accomplished in that the substrate-holding device is designed as a one-piece ceramic element having variably heavily doped layers. Owing to the one-piece nature of the ceramic element, opposing surfaces defining the interface between layers in the multipart structure according to the prior art, are avoided. This causes a reduction in the influence of the tribolectric effect. In addition, material properties may be adjusted so that they satisfy the technical requirements of conductivity, resistivity and the like. For example, the impedance level of the arrangement is therefore adjustable.

In a favorable embodiment of the invention, a ceramic element is doped to provide a first layer region at least partially enclosing the surface that has a high electrical conductivity less than $10^{-1}$ to $10^{-3}$ Ωcm. The ceramic element also includes a second layer region located under the first layer region which exhibits an insulating resistance greater than $10^{10}$ to $10^{12}$Ω and a third layer region located thereunder which is doped to provide a high electrical conductivity less than $10^{-1}$ to $10^{-3}$ Ωcm. The first layer is provided with an external contact connection for connection of a force potential and the third layer with an external contact connection for connection to a guard potential.

The possibility of a triaxial structure is thereby provided. Here, the substrate to be tested is placeable on the first layer, which has a conductive layer. This first layer serves for a carrying force potential.

In an alternative embodiment of the invention, it is provided that a first insulating layer at least partially enclosing the surface has an insulating resistance greater than $10^{10}$ to $10^{12}$Ω, an absorption layer located under the first insulating layer that has a high electrical conductivity less than $10^{-1}$ to $10^{-3}$ Ωcm and a second insulating layer located thereunder again that has an insulating resistance greater than $10^{10}$ to $10^{12}$Ω.

This embodiment makes it possible to perform HF measurements on substrates. There, the first insulating layer with the absorption layer results in an impedance level that is adjustable according to the insulating or dielectric properties of the first insulating layer and the conductivity of the absorption layer.

In an additional embodiment of the invention, it is provided that the substrate has under the third layer a fourth layer with a great insulating resistance.

This fourth layer serves for insulation of the third layer downward. This may be advantageous in order to arrange additional layers under the third layer or in order to place the arrangement on a conductive element.

In one embodiment of the invention, the substrate-holding device is placeable on a thermochuck. Such a thermochuck normally is itself designed for holding substrates. In addition, it has thermo-electric elements for moderating the temperature of the substrate. In this alternate embodiment, the substrate is not placed directly on the thermochuck. Rather, the substrate-holding device according to the invention is arranged between the thermochuck and the substrate.

Thus, on the one hand the targeted thermal influence of the substrate may be achieved via the thermochuck. On the other hand, with the use of a standard chuck with the aid of the substrate-holding device according to the invention, a substrate holder according to the triaxial principle may be obtained without the disadvantages of the prior art.

Here it is possible to act on the thermochuck with shield potential. Thus, the substrate-holding device, as a relatively thin add-on plate, would be shielded by the thermochuck itself.

Another possibility for implementing temperature control of the substrate is that the substrate-holding device is provided in the region of the fourth layer with electric heating elements consisting of doped layer regions. Thus, heating for moderation of the substrate temperature in the interior of the one-piece substrate-holding device is implemented by transit paths as resistance paths in the interior region of the ceramic element thereof.

To ensure high surface homogeneity of heating, it is advantageous that the layer regions of heating be designed spiral-like or meandering in the top view and have external contact connections.

In an additional embodiment of the invention, it is provided that the first layer is introduced in the center of the surface, leaving free a peripheral region on the surface. The second layer projects in the peripheral region of the surface. The third layer is designed bowl-shaped, surrounds the first layer in the peripheral region and includes side wall portions which project all the way to the surface. It can thus be ensured that the guard potential-carrying third layer surrounds the first layer, so that no interfering effects can occur at the sides of the first layer, either.

There are two possibilities for implementation of a shield potential-carrying layer. For one, a fifth layer having high electrical conductivity may be provided under the fourth layer, which is acted on by shield potential.

For this purpose, it is advantageous that the fifth layer be arranged on the outside with the surface being left free. Thus, the fifth layer surrounds all the rest of the substrate-holding device and protects it from the outside.

BRIEF DESCRIPTION OF THE DRAWINGS

The invention will be explained in detail below by way of three specific examples of preferred embodiments. In the accompanying drawing.

DETAILED DESCRIPTION OF PREFERRED EMBODIMENTS

Figure 1:
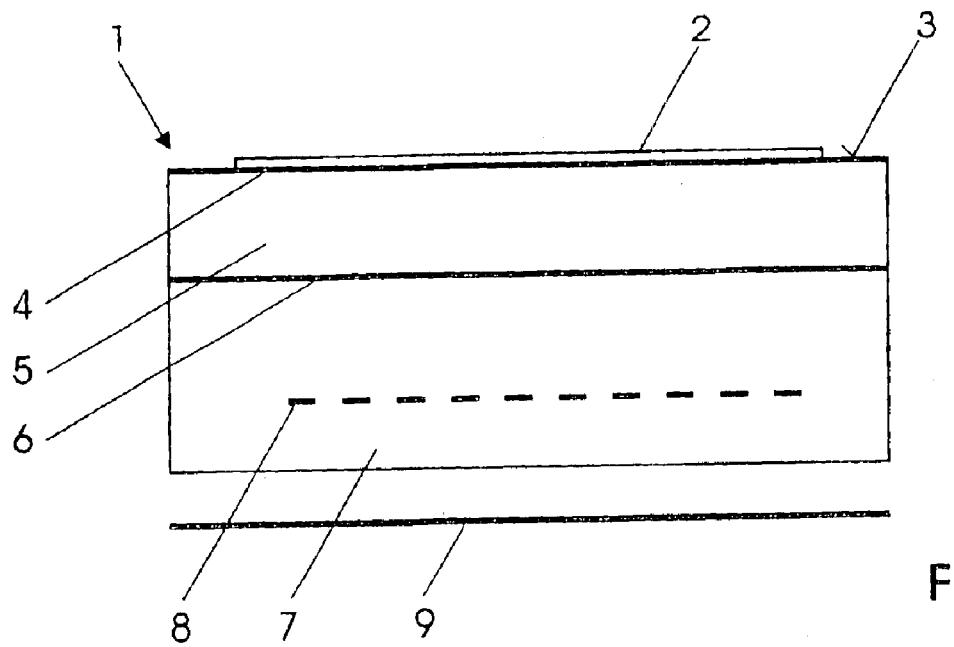
FIG. 1 is a schematic representation of a cross section through a triaxial substrate-holding device designed as an add-on plate.

In the figures, the substrate-holding device in the form of a ceramic element 1 for probes for testing circuit arrangements on substrates under test 2 is described in three different embodiments.

Wafers, such as semiconductor wafers which are structured as chips, are generally disc-shaped substrates 2 under test. The chips include the circuit arrangement to be tested and are present in the complete wafer formation.

The substrate-holding devices 1 represented have a surface 3 for the accommodation of a substrate 2 to be tested. In addition, they have provisions, not represented in detail, for holding the substrate 2 to the surface 3. This generally takes the form of groove-like recesses in the surface 3, which are connected with a vacuum source. These groove-like recesses are sealed by the placement of the substrate 2, owing to which they are able to build up a vacuum in the recesses, which then sucks the underside of the substrate 2 onto the surface 3.

However, other means for holding the substrate 2 are alternatively employable, for instance clamping devices, which clamp the substrate 2 mechanically onto the surface 3. This may be necessary when the substrate-holding device 1 is to be used under a vacuum, where vacuum-holding devices would otherwise be unsuitable.

As further shown in the drawing, the substrate-holding device 1 is designed as a one-piece ceramic element having variably heavily doped layer regions 4, 5, 6 and/or 7, specifically with an electrically conductive first layer region 4, an electric insulating second layer region 5, an electrically conductive third layer region 6 and an electric insulating fourth layer region 7.

The first layer region 4 has a connection, not represented in detail, for applying a force potential. The third layer region 6 is provided with a connection, likewise not represented in detail, for applying a guard potential.

As shown in FIG. 1, the first layer region 4 encloses the entire surface 3 of the ceramic element. The second layer region 5, third layer region 6 and the fourth layer region 7 are arranged parallel thereto. The fourth layer region 7 serves as a bottom outer protective layer, by which the substrate-holding device 1 is placeable on a chuck 9.

The chuck 9 is acted on by shield potential. This makes it possible to enlarge a conventional chuck 9 functionally for a triaxial structure.

In principle, it is possible to design the chuck 9 as a thermochuck in order to bring the substrate 2 to a given temperature in which measuring operations are to take place. In this regard, heating as well as cooling is possible.

As shown in FIG. 1, heating elements 8 are provided in the fourth layer 7. The heating elements 8 likewise consists of doped layer regions within the ceramic element, so that its homogeneity need not be disturbed by the arrangement of heating elements 8. The layer regions in the top view, not shown in detail, are designed spiral-like or meandering and have external contact connections to receive a supply of electric energy.

With the arrangement of heating element 8 in the fourth layer region 7, it also becomes possible to combine this substrate-holding device 1 with a thermochuck 9, the thermochuck 9 then assuming the cooling operations if the substrate 2 must be kept in lower temperature ranges during measurement. Measurement at higher temperatures is obtained by the integrated heating element 8. The multiplicity of uses of such a combination is thus considerably increased.

Figure 2:
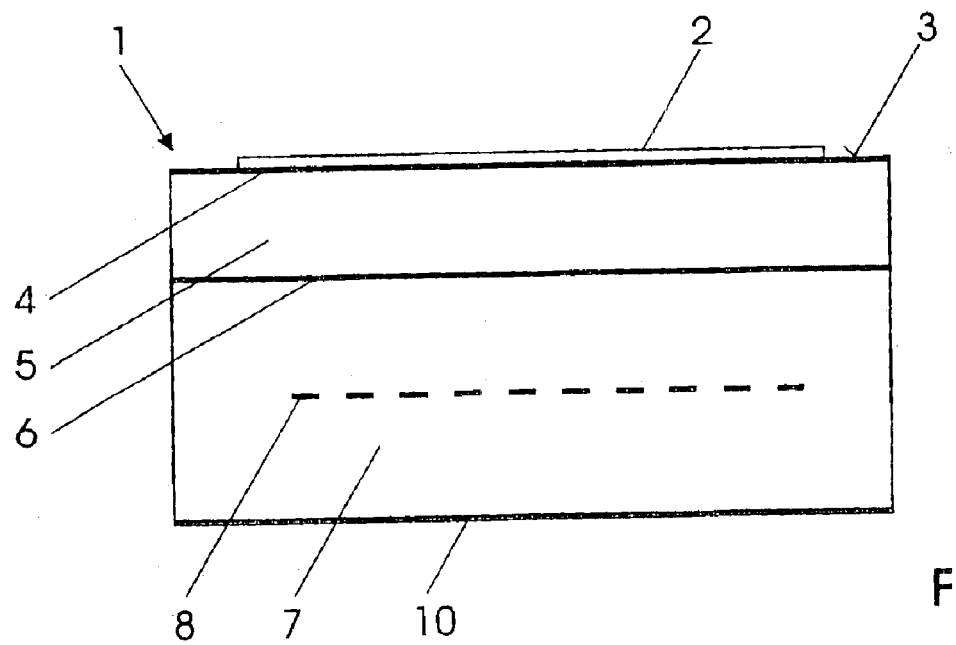
FIG. 2 is a schematic representation of a cross section through a triaxial substrate-holding device according to the invention with integrated heating.
Figure 3:
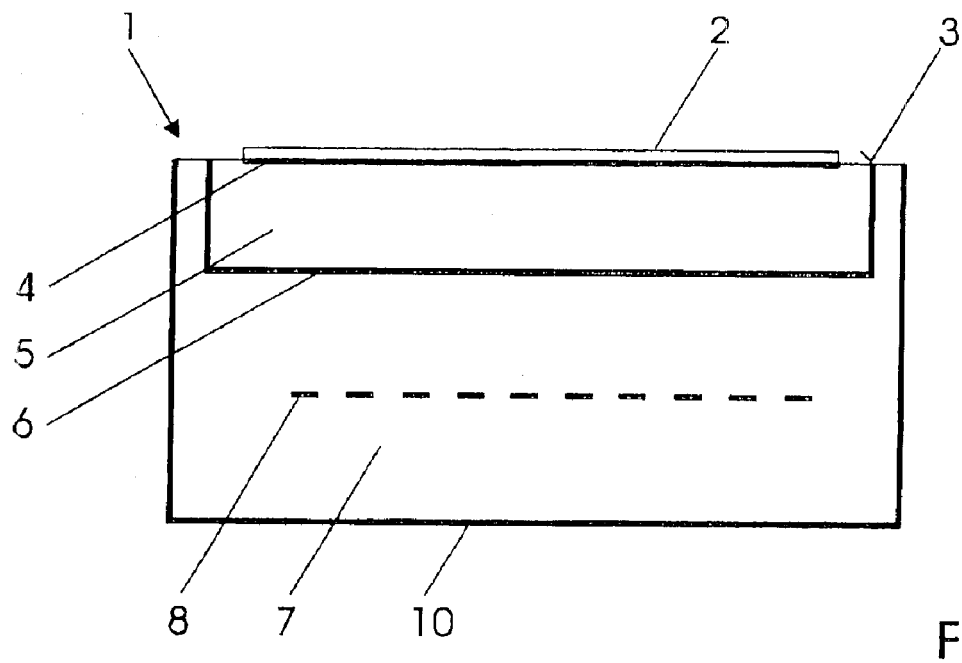
FIG. 3 is a schematic representation of a cross section through a triaxial substrate-holding device according to the invention with a bowl-shaped third layer.

Such heating 8 is also provided in the arrangements of FIG. 2 and FIG. 3.

As shown in FIG. 3, the first layer region 4, while leaving a peripheral region on the surface 3 free, is introduced in the center of surface 3. The second layer region 5 projects into the peripheral region of the surface 3. Lastly, the third layer region 6 is designed in a bowl-shaped arrangement which surrounds the first layer 4 and includes sidewall portions that project all the way to the surface 3 in the peripheral region.

In contrast to the arrangement of FIG. 1, in which the shield function is assumed by the chuck 9, an electrically conductive fifth layer region 10, which is acted on by shield potential, is provided in the examples of FIG. 2 and FIG. 3.

According to FIG. 3, the fifth layer region 10 is arranged on the whole outer side of the substrate-holding device 1, the surface 3 being left exposed.

According to FIG. 2, the fifth layer region 10 is arranged parallel to the first layer 4 all the way to the fourth layer 7.

Figure 4:
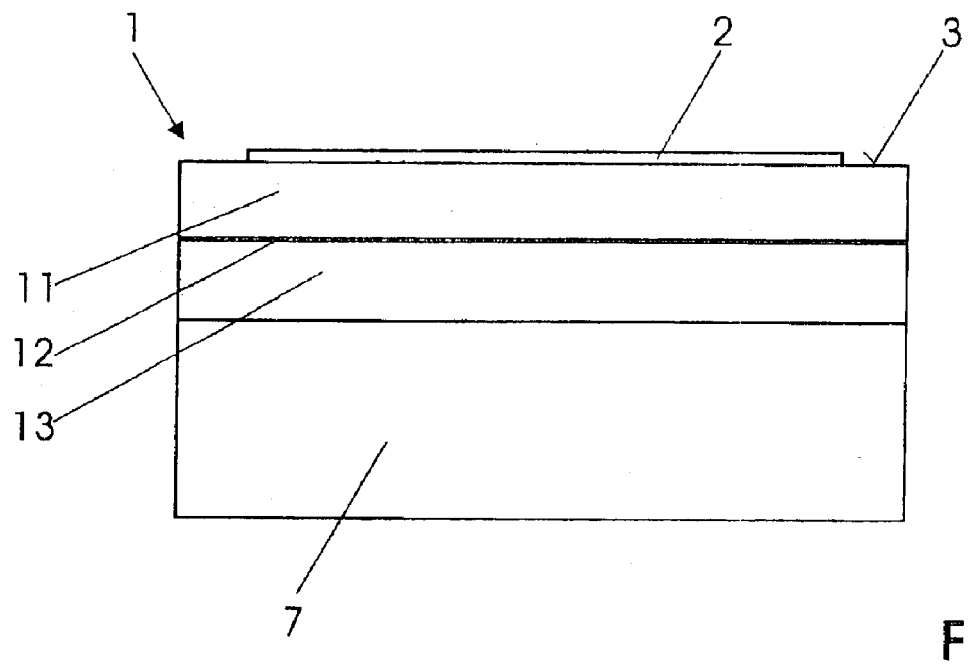
FIG. 4 is a schematic representation of a cross section through a substrate holder according to the invention for HF measurement.

A substrate-holding device 1 for HF measurement is represented in FIG. 4. This has a first insulating layer 11, which has an insulating resistance greater than $10^{10}$ to $10^{12} \Omega$. The first insulating layer region 11, like the first layer region 4 in the other representations, encloses at least partially the surface 3. Under the first insulating layer 11, there is arranged an absorption layer 12 with high electrical conductivity, less than $10^{-1}$ to $10^{-3}$ $\Omega$cm. Lastly, a second insulating layer 13, located under absorption layer 12, again has a high insulating resistance, greater than $10^{10}$ to $10^{12} \Omega$. Thus, the structure of FIG. 4 shows a sequence of layers reversed in conductivity or in insulating resistance.

What is claimed is:

1. A device for holding a substrate during testing of circuit arrangements on the substrate comprising a ceramic element having a substrate receiving surface and a thickness, the ceramic element having at least one conductive layer region formed within said thickness and the ceramic element having at least one insulative layer region formed within said thickness, wherein:

the at least one conductive layer region includes a first layer, at least partially enclosing the substrate receiving surface and a third layer;

the at least one insulative layer includes a second layer interposed between the first layer and the third layer; and the first layer is provided with an external contact connection for connection of a force potential and the third layer with an external contact connection for connection to guard potential.

2. The device for holding a substrate according to claim 1, wherein the at least one insulative layer further comprises a fourth layer beneath said third layer.

3. The device for holding a substrate according to claim 2, wherein the at least one conductive layer further comprises a fifth layer provided under the fourth layer.

4. The device for holding a substrate according to claim 3, wherein the fifth layer is arranged on the outside of the ceramic element with the surface being left free.

5. The device for holding a substrate according to claim 1, wherein the at least one conductive layer has an electrical conductivity less than $10^{-1}$ to $10^{-3}$ ohm-cm and the at least one insulative layer has an insulating resistance greater than $10^{10}$ to $10^{12}$ ohms.

6. The device for holding a substrate according to claim 1, wherein the device is placeable on a thermochuck.

7. The device for holding a substrate according to claim 1, further comprising a region of electric heating elements disposed in one of the at least one insulative layers.

8. The device for holding a substrate according to claim 7, wherein the region of electric heating elements is formed in a spiral-like manner in the top view and includes external contact connections.

9. The device for holding a substrate according to claim 1, wherein:

the first layer is introduced in the center of the surface leaving free a peripheral region on the surface, the second layer projects in the peripheral region of the surface, and the third layer is designed in a bowl-shaped configuration that surrounds the first layer, the third layer including side wall portions which project through the thickness of the element into the peripheral region of the surface.

10. A device for holding a circuit substrate for high frequency measurements, comprising a ceramic element, the ceramic element comprising:

a substrate receiving surface;

a first insulating layer, wherein the first insulating layer has a resistance greater than about $10^{10}$ to $10^{12}$ ohms and wherein the first insulating layer is disposed adjoining the substrate receiving surface;

an absorption layer disposed underneath the first insulating layer, wherein the absorption layer has high electrical conductivity less than about $10^{-1}$ to $10^{-3}$ ohm-cm; and a second insulating layer disposed underneath the absorption layer, wherein the a second insulating layer has a resistance greater than about $10^{10}$ to $10^{12}$ ohms.

* * * * *